(12) United States Patent
Liao et al.

(10) Patent No.: US 6,191,019 B1
(45) Date of Patent: Feb. 20, 2001

(54) METHOD FOR FORMING A POLYSILICON LAYER IN A POLYCIDE PROCESS FLOW

(75) Inventors: Chih-Cherng Liao, Hsinchu; Jiunn-Liang Yu, Taipei; Chan-Jen Kuo, Tainan; Chi-San Wu, Taipei; Yun-Chi Jiang, Taichung, all of (TW)

(73) Assignee: Vanguard International Semiconductor Corporation, Hsnincu (TW)

( * ) Notice: Under 35 U.S.C. 154(b), the term of this patent shall be extended for 0 days.

(21) Appl. No.: 09/229,231

(22) Filed: Jan. 12, 1999

(51) Int. Cl.[7] .............................................. H01L 21/3205
(52) U.S. Cl. .......................... 438/592; 438/586; 438/655
(58) Field of Search ................................... 438/592, 586, 438/655

(56) References Cited

U.S. PATENT DOCUMENTS

| | | | |
|---|---|---|---|
| 4,786,611 | * 11/1988 | Pfiester . | |
| 5,256,894 | * 10/1993 | Shino . | |
| 5,272,099 | * 12/1993 | Chou et al. . | |
| 5,355,010 | * 10/1994 | Fujii et al. . | |
| 5,827,762 | * 10/1998 | Bashir et al. . | |
| 5,837,601 | * 11/1998 | Matsumoto . | |
| 5,924,001 | * 7/1999 | Yang et al. . | |
| 5,989,950 | * 11/1999 | Wu . | |

* cited by examiner

Primary Examiner—Richard Booth
Assistant Examiner—Lynne A. Gurley
(74) Attorney, Agent, or Firm—Christensen O'Connor Johnson Kindness PLLC

(57) ABSTRACT

A method for preventing void formation in a gate of a transistor formed in a substrate is disclosed. The method comprises: forming a gate oxide layer on the substrate; forming a polysilicon layer on the gate oxide layer; performing an ion implantation on the polysilicon layer, the ion implantation performed with a power approximately 30 KeV and a dosage about more than $10^{15}$ atoms/cm$^2$; and forming a silicide layer on the polysilicon layer.

14 Claims, 9 Drawing Sheets

METHOD FOR FORMING A POLYSILICON LAYER IN A POLYCIDE PROCESS FLOW

TECHNICAL FIELD OF THE INVENTION

This invention relates to a method for forming a polysilicon layer in a polycide layer, and more particularly, relates to a method for forming a polysilicon layer in fabricating a polycide layer of a gate electrode of a transistor.

BACKGROUND OF THE INVENTION

As semiconductor technology progresses, more devices must be implemented in a single chip. This requires that the line width of a semiconductor device become smaller. In the prior art, when a transistor is to be fabricated (see FIG. 1), a single crystal silicon substrate 100 with a crystallographic orientation of <100> is used. A thick field oxide (FOX) region is formed to provide isolation between devices on the silicon substrate. Sequentially, a first dielectric layer 102 is formed on the top surface of the substrate 100 to serve as the gate oxide for the MOSFET. The first dielectric layer 102 is typically a silicon dioxide layer.

The next step is to form a polysilicon layer 103 and a tungsten silicide layer 104 over the gate oxide. Next, the standard photolithography and etching steps are used to form a gate structure of the MOSFET (see FIG. 2). After the gate is formed, the photoresist pattern 113 is removed and an ion implantation step is used to define the source and drain electrodes of the transistor.

Referring to FIG. 3, ion implantation 120 is performed using the gate as the mask. The ion penetrates the first dielectric layer 102 to form a first doped region 122 in the substrate 100. The first doped region 122 is formed by the phosphorous dose of approximately $10^{13}$ ions/cm$^2$. Then an annealing step is used after the implantation step to repair the damaged lattice.

The photoresist pattern 113 is then stripped. A dielectric layer 130 as shown in FIG. 4 is then formed. Turning to FIG. 5, the dielectric layer 130 is then anisotropically etched to form sidewall spacers 140.

Referring to FIG. 6, to form a second doped region 161, a second ion implantation 160 is performed. The gate serves as a mask when the second ion implantation 160 is processed. The second doped region 161 can be formed by arsenic ion implantation with a dosage of approximately $5 \times 10^{15}$ ions/cm$^2$.

Referring to FIG. 7, a BPSG layer 165 is formed on the wafer. Then a masking and etching step is used to etch the BPSG layer 165 to form the contact hole 167.

Finally, referring to FIG. 8, a metal layer 170 is patterned into the contact holes and a passivation layer 175 is formed. The passivation layer mentioned above is typically composed of silicon nitride and PSG.

In the foregoing steps, all of the thermal processes, such as annealing, have an effect on the gate layers 103 and 104. The resistance of the tungsten silicide layer 104 is high (about 750–850 μm-cm) when the etching process forming the gate is performed. Therefore, an annealing process is performed to reduce the resistance of the gate tungsten silicide layer 104 to below 70 μm-cm. However, the annealing process mentioned above results in the diffusion of silicon atoms from the polysilicon layer 103 to the gate tungsten silicide layer 104. This causes a void in the gate polysilicon layer 103.

The present invention provides a method for forming a transistor as well as preventing void formation in a gate electrode of said transistor.

SUMMARY OF THE INVENTION

A method for preventing void formation in a gate of a transistor formed in a substrate is disclosed. The method comprises: forming a gate oxide layer on said substrate; forming a polysilicon layer on said gate oxide layer; performing an ion implantation on said polysilicon layer, said ion implantation performed with a power in the range of about about 30 or more than 30 KeV and a dosage of about $10^{15}$ or more than $10^{15}$ atoms/cm$^2$; and forming a silicide layer on said polysilicon layer.

Further, a method for forming a transistor on a substrate is disclosed. The method comprises: forming a gate oxide layer on said substrate; forming a polysilicon layer on said gate oxide layer; performing a first ion implantation on said polysilicon layer; forming a silicide layer on said polysilicon layer; patterning and etching said polysilicon layer and said silicide layer to form a gate structure; annealing said polysilicon layer and said silicide layer; performing a second ion implantation to form a first doped region in said substrate; forming a spacer on the side wall of said gate structure to form a gate electrode; performing a third ion implantation to form a second doped region in said substrate; forming a dielectric layer over said gate electrode and said first and second doped region; patterning said dielectric layer to expose said second doped region; forming a conductive layer over said dielectric layer and said second doped region; patterning and etching said conductive layer to be coupled to said second doped region; and forming a passivation layer on said conductive layer and said dielectric layer.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1:
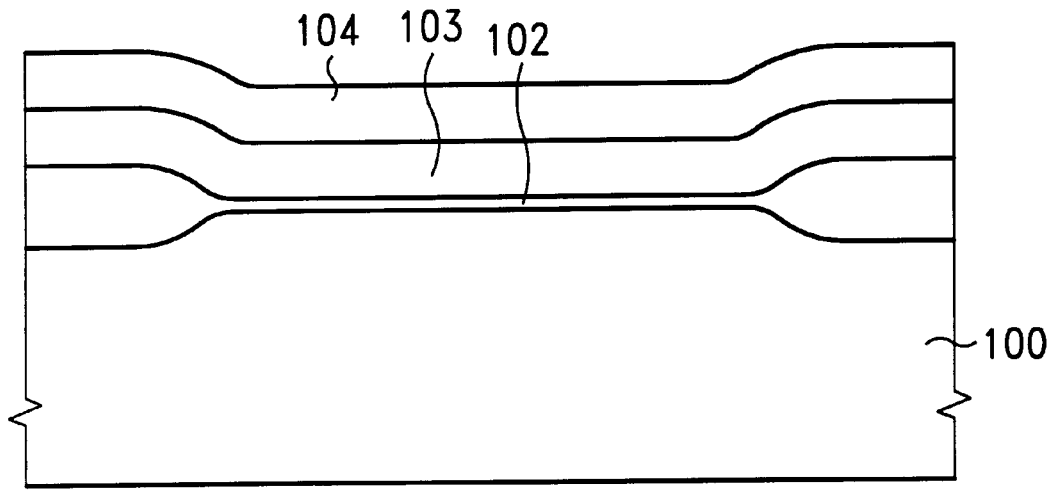
FIGS. 1–8 show a prior art method of fabricating a transistor.
Figure 2:
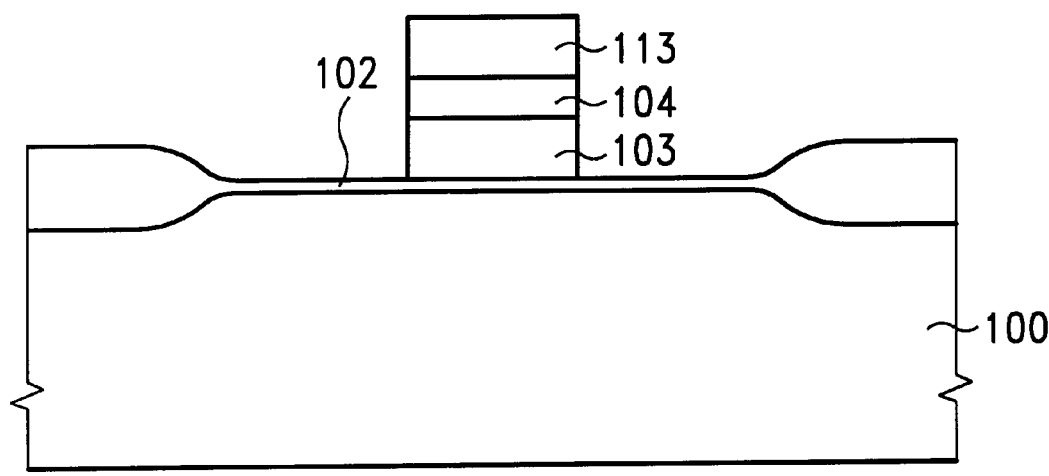
Figure 3:
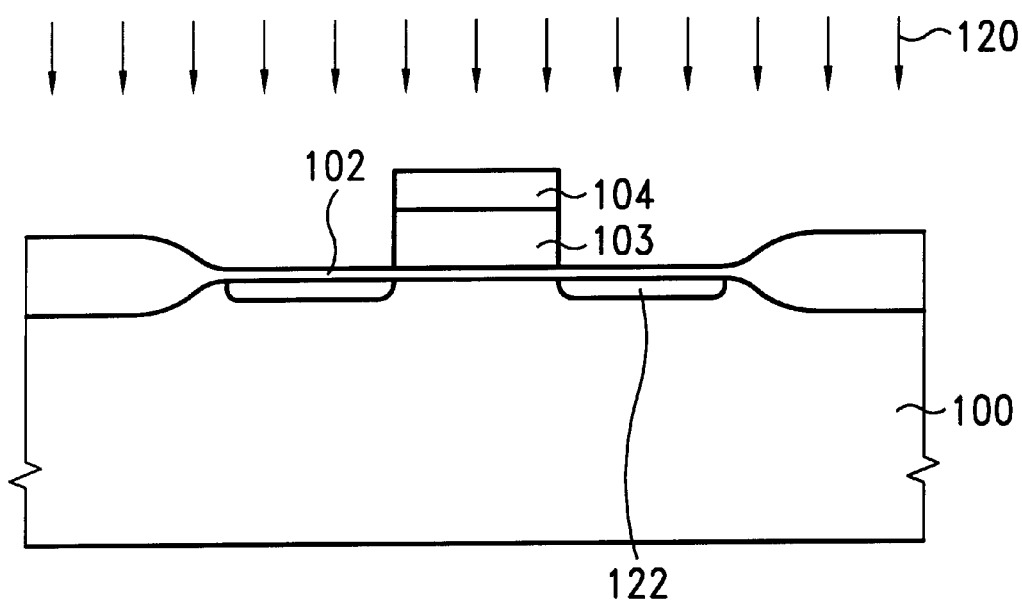
Figure 4:
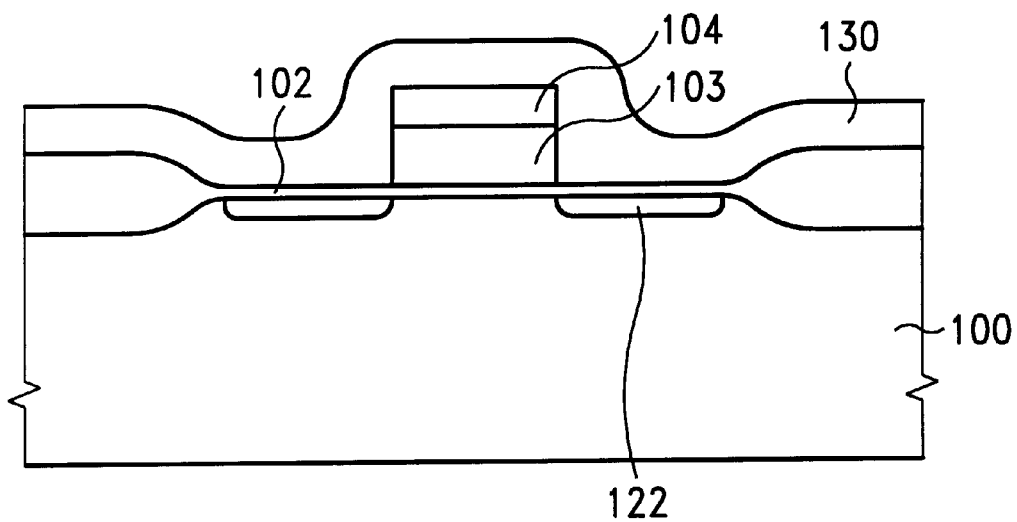
Figure 5:
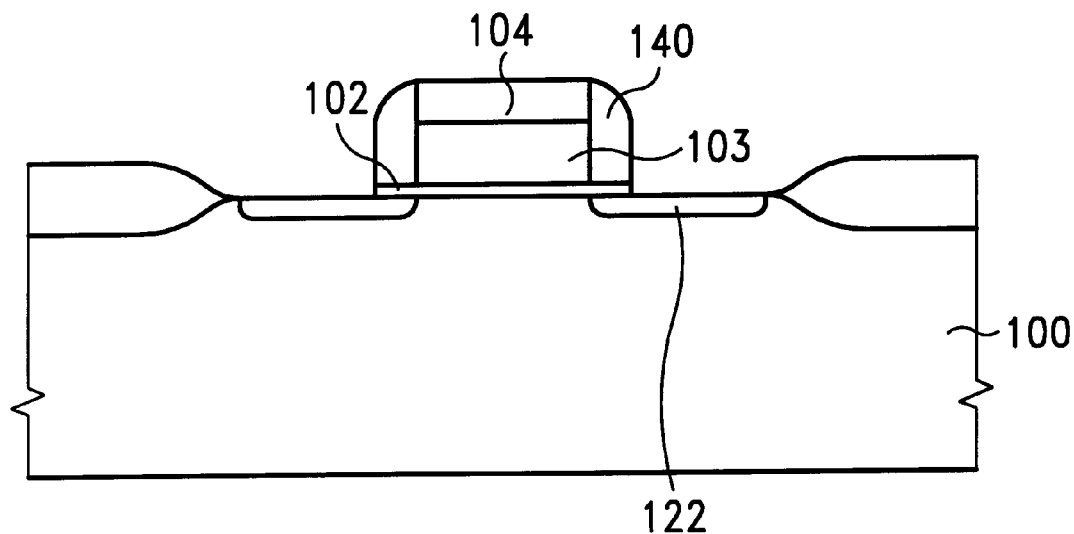
Figure 6:
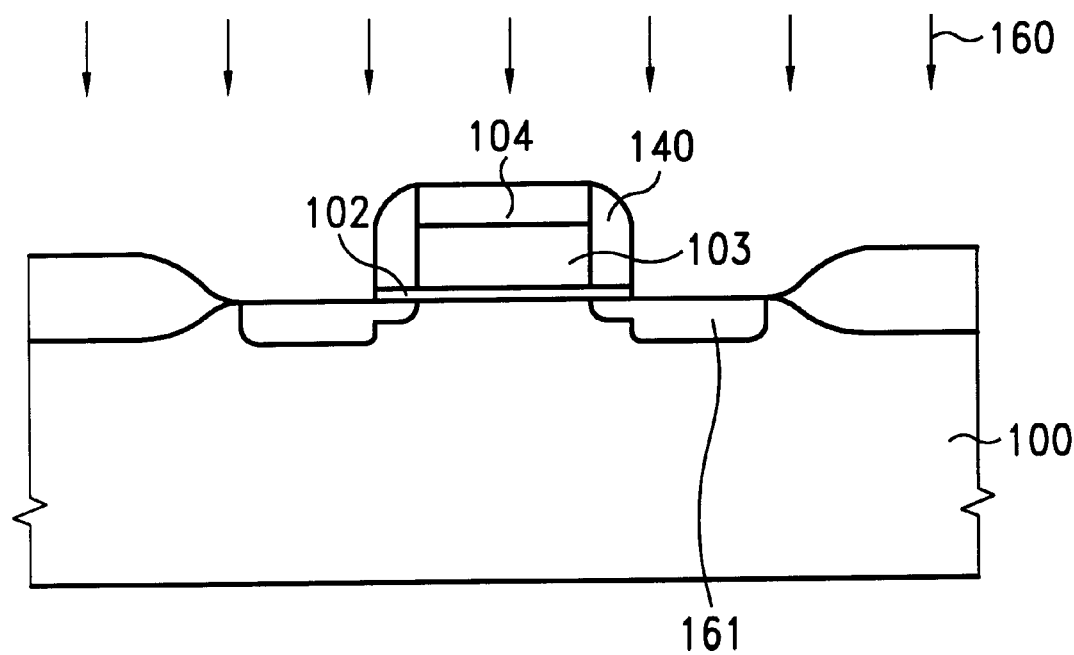
Figure 7:
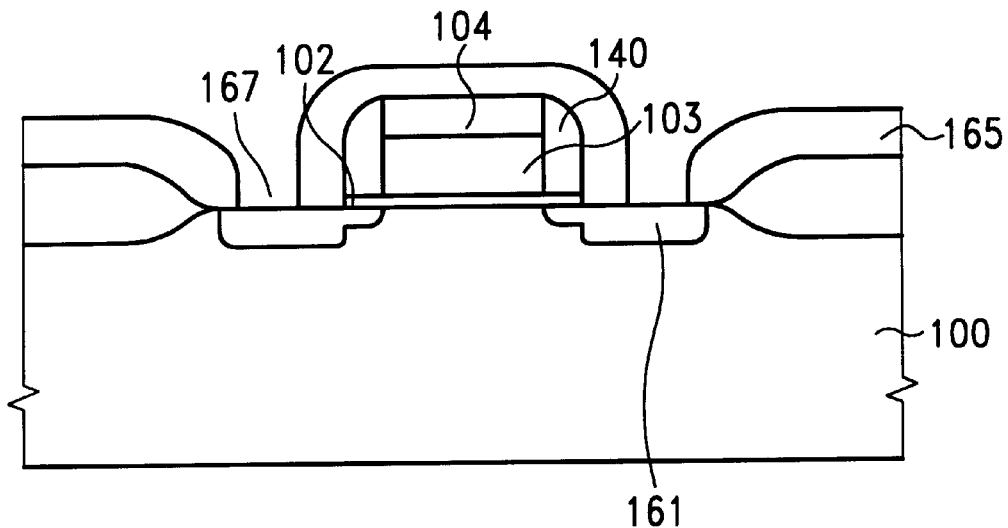
Figure 8:
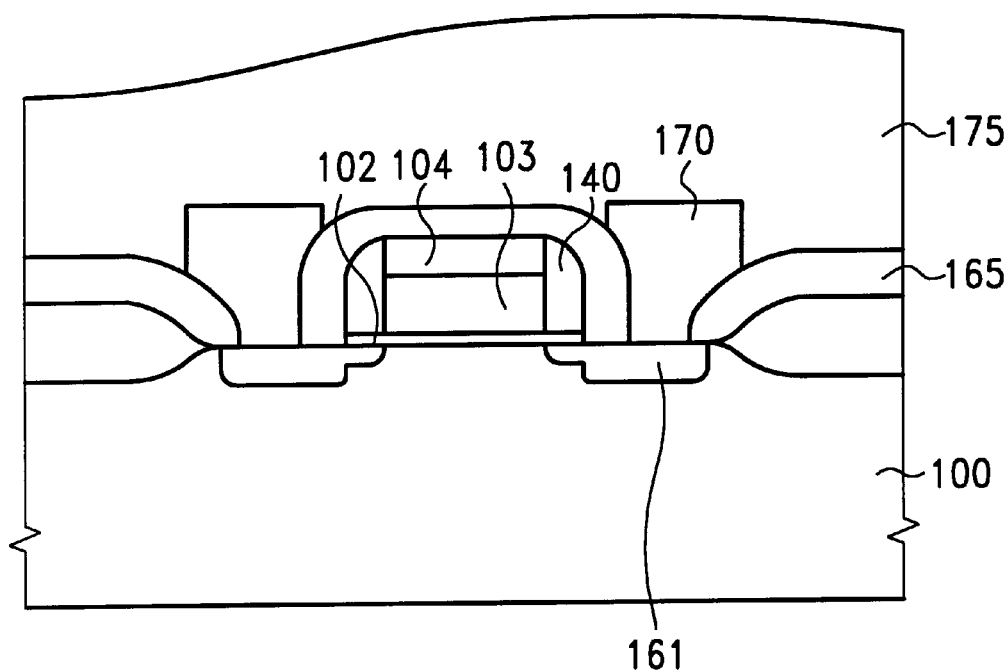
Figure 9:
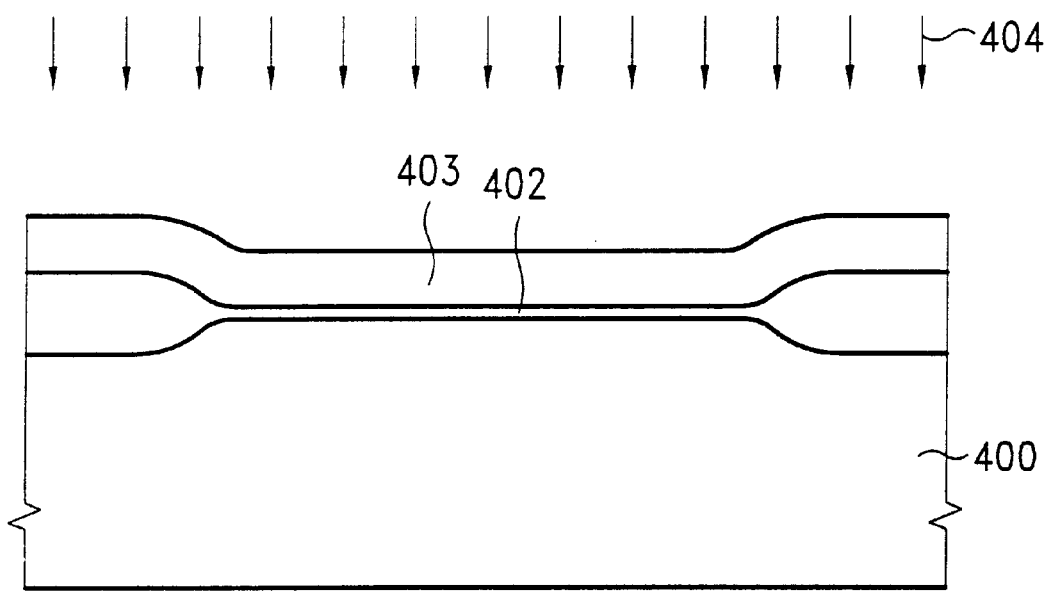
FIGS. 9–17 show the fabrication of a transistor according to the preferred embodiment of the present invention.

The present invention provides a method for fabricating a transistor without voids resulting from the annealing process. Referring to FIG. 9, a single crystal silicon substrate 400 with a crystallographic orientation of <100> is provided. A thick field oxide (FOX) region is formed to provide isolation between devices on the silicon substrate.

Next, a first layer 402 is formed on the top surface of the substrate 400 to serve as the gate oxide. The first layer 402 is preferably a silicon dioxide layer that is formed by using an oxygen steam ambient, at a temperature of about 800–1100° C. in one embodiment. Preferably, the thickness of the silicon dioxide layer is approximately 15–250 angstroms.

The next step is to form a second layer 403 over the gate oxide layer 402. The second layer is preferably formed from polysilicon. To avoid the formation of voids, the present invention includes a first ion implantation 404 to the second layer 403. If the transistor that is to be fabricated is a NMOS, the ion implantation 404 is As, and if the transistor that is to be fabricated is a PMOS, the ion implantation 404 is BF$_2$. The dosage of the ion implantation 404 is about $10^{15}$ or more than $10^{15}$ atoms/cm$^2$, and range of the source power of the ion implantation 404 is about 30 KeV or more than 30 KeV.

Figure 10:
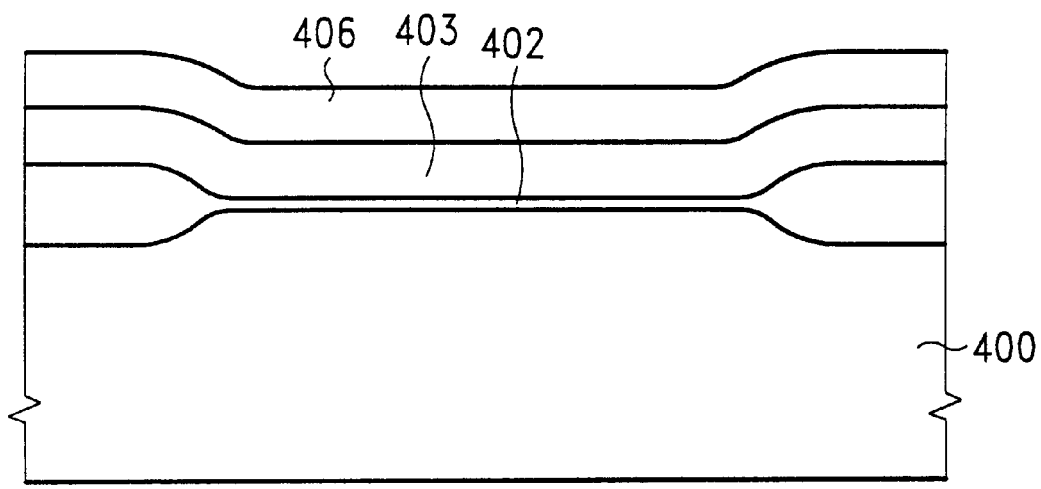

Next, a third layer 406 is formed on the second layer 403. Referring to FIG. 10, the thickness of the second layer 403 is about 500–3000 angstroms and the thickness of the third dielectric layer is about 300–2000 angstroms. In this embodiment, the third layer 406 is a tungsten silicide layer.

Figure 11:
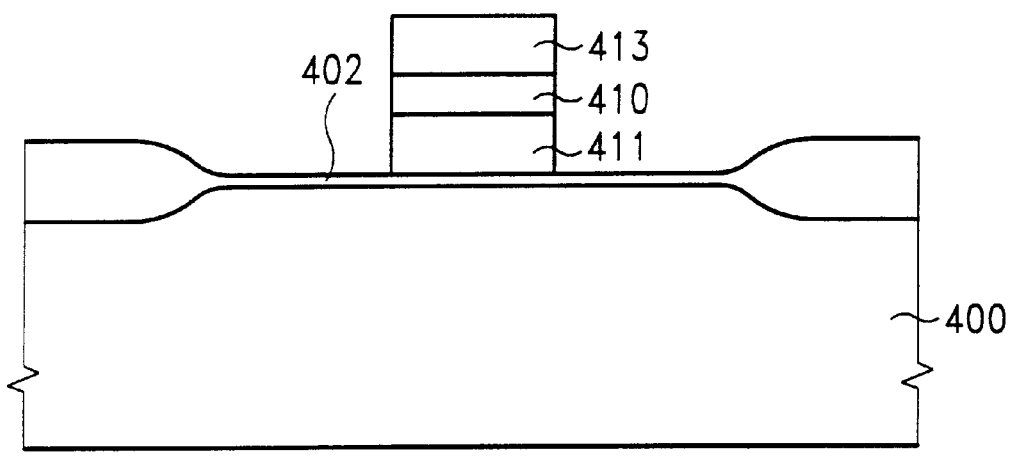

Next, conventional photolithography and etching steps are used to form a gate structure. As seen in FIG. 11, a photoresist layer 413 is used to mask the polysilicon layer 411 and the tungsten silicide layer 410 to form a gate structure. The etchant used in the aforementioned standard etching step can be $CF_4+O_2$, $CHF_3$, $C_2F_6$, or $SF_6+He$. After the gate tungsten silicide layer 410 and the gate polysilicon layer 411 are formed, the photoresist layer 413 is removed and an ion implantation step is used to define the source and drain electrodes of the transistor.

Figure 12:
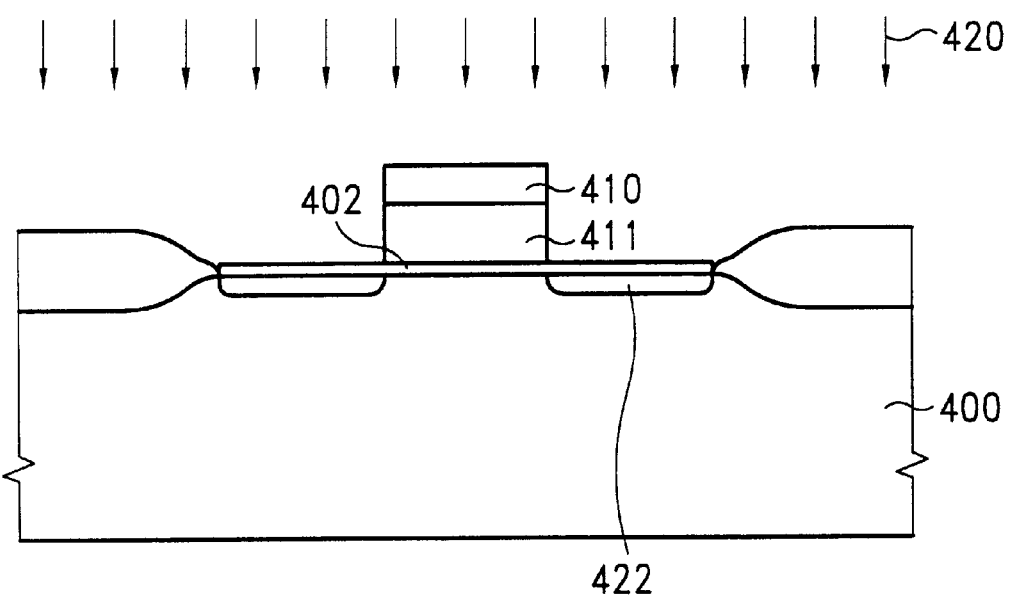

Referring to FIG. 12, a second ion implantation 420 is performed using the gate tungsten silicide layer 410 and the gate polysilicon layer 411 as the mask. The ions penetrate the gate oxide layer 402 to form a first doped region 422 in the substrate 400. The first doped region 422 can be formed by phosphorous $n^-$ dose or boron $p^-$ dose. In this preferred embodiment, the first doped region 422 is formed by the phosphorous $n^-$ dose of approximately $10^{13}$ ions/cm$^2$. Then an annealing step is used after the implantation step to repair the damaged lattice.

Figure 13:
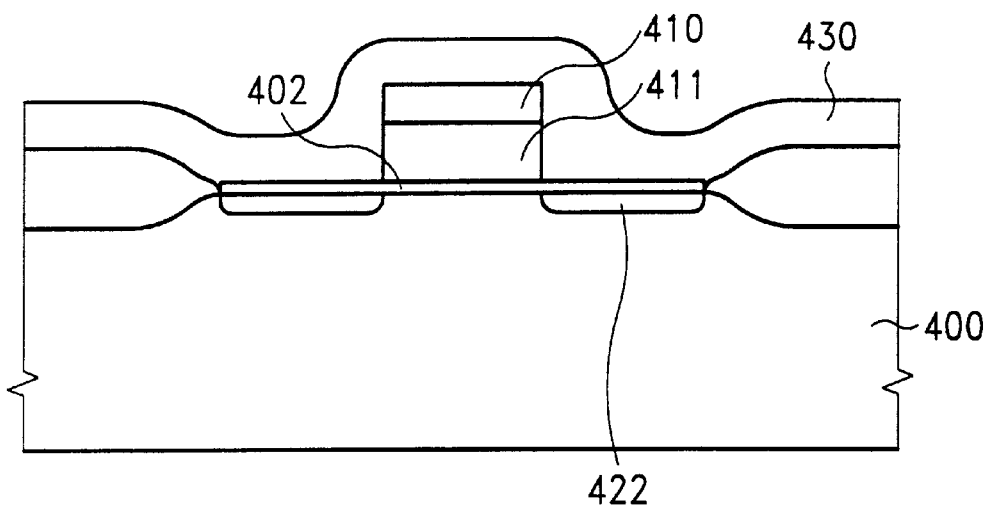
Figure 14:
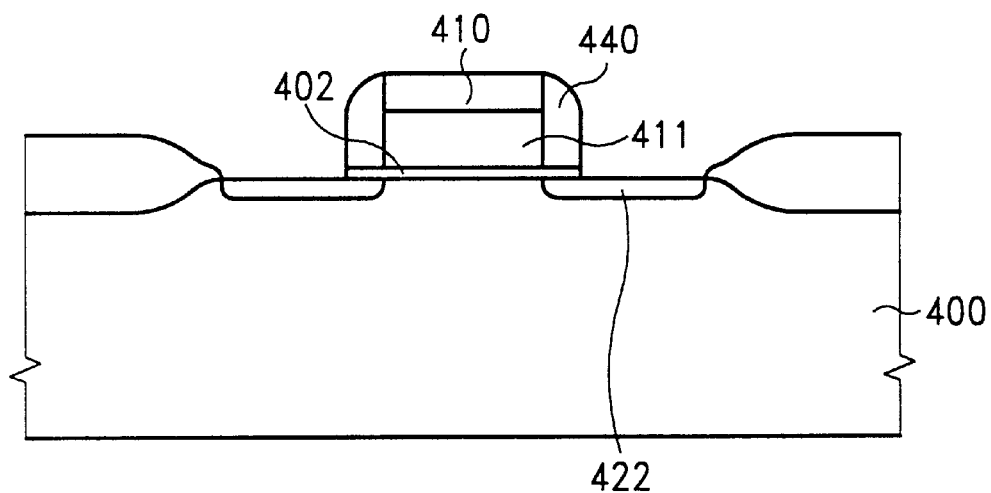

Next, referring to FIG. 13, a dielectric layer 430 is formed on the wafer. The dielectric layer 430 is then anisotropically etched to form sidewall spacers 440 (shown in FIG. 14). The dielectric layer 430 is preferably formed from silicon dioxide. The spacers 440 are formed on the sidewalls of the gate tungsten silicide layer 410 and the gate polysilicon layer 411. The etchant that is used to etch back the fourth dielectric layer 430 can be one of the following: $CHF_3$, $C_3F_8$, $CF_4+O_2$ or $C_2F_6$.

Figure 15:
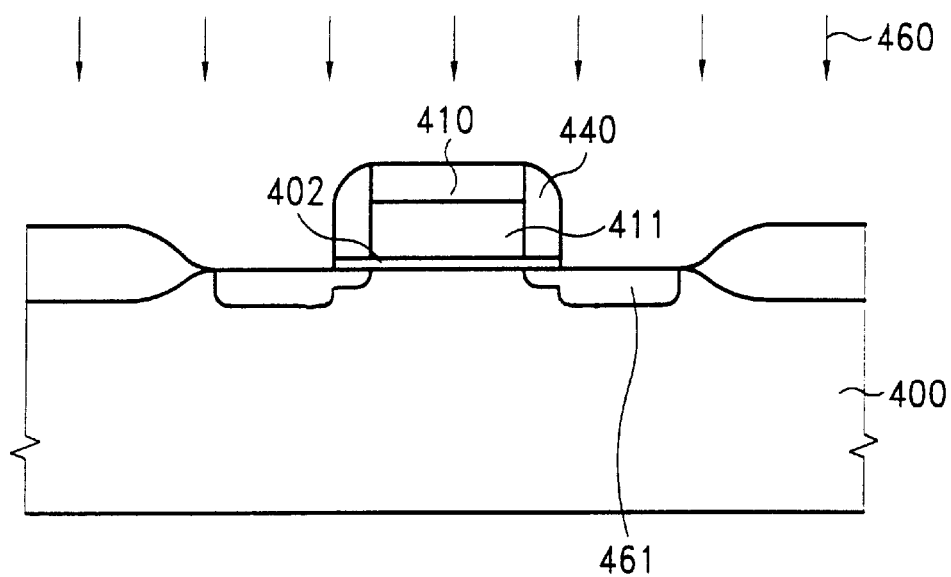

Turning to FIG. 15, a third ion implantation 460 is performed. The gate tungsten silicide layer 410 and the gate polysilicon layer 411 serve as a mask when the third ion implantation 460 is performed. The second doped region 461 can be formed in the substrate 400 by the arsenic $n^+$ or boron $p^+$ ion implantation. In this example, the second doped region 461 can be formed by arsenic $n^+$ ion implantation with the dosage of approximately $10^{15}$ ions/cm$^2$.

Figure 16:
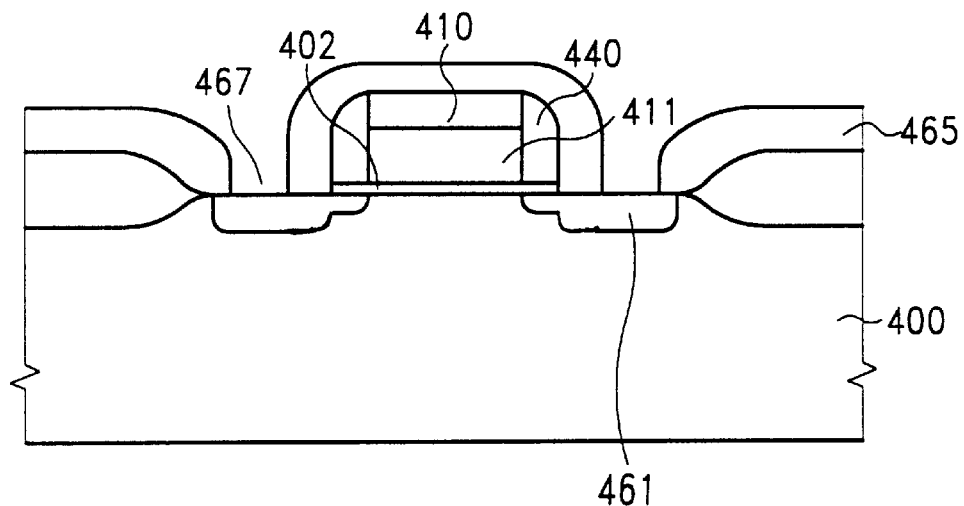

Referring to FIG. 16, the next step is to form a BPSG layer 465 on the wafer. Then a conventional masking and etching step is used to etch the BPSG layer 465 to form a contact hole 467.

Figure 17:
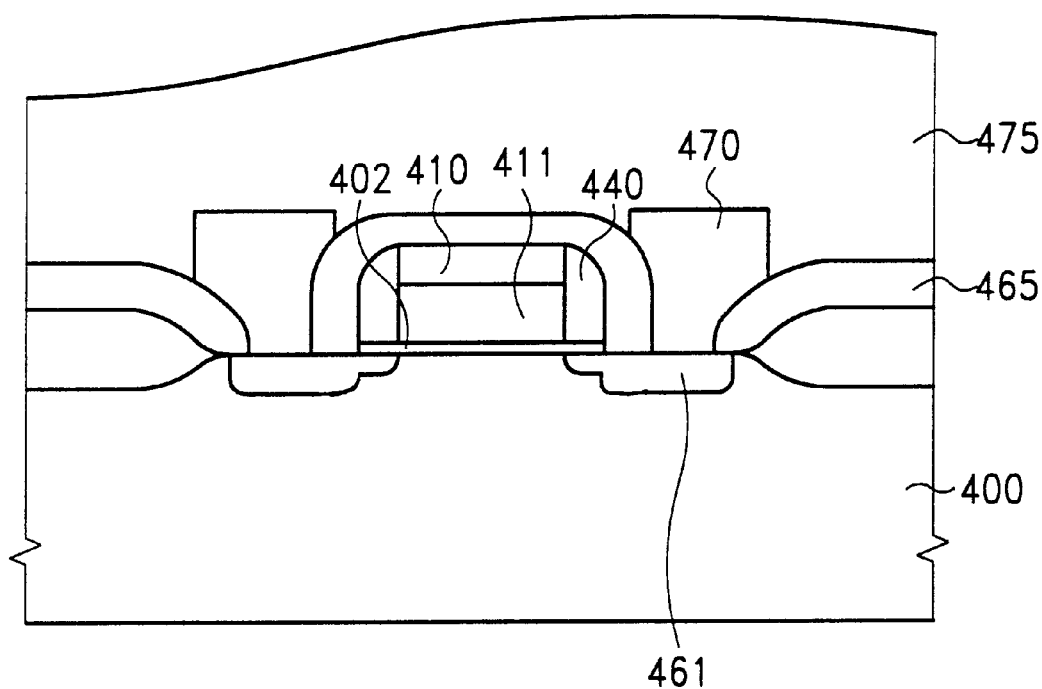

Referring to FIG. 17, as in the prior art, the metal layer 470 is patterned and the passivation layer 475 is formed. The passivation layer 475 is typically composed of silicon nitride and PSG.

As will be understood by persons skilled in the art, the foregoing preferred embodiment of the present invention is illustrative of the present invention rather than limiting the present invention. While the preferred embodiment of the invention has been illustrated and described, it will be appreciated that various changes can be made therein without departing from the spirit and scope of the invention.

What is claimed is:

1. A method for preventing void formation in a gate of a transistor formed in a substrate, the method comprising:

forming a gate oxide layer on said substrate;

forming a polysilicon layer on said gate oxide layer;

performing an ion implantation on said polysilicon layer, said ion implantation performed with a power approximately 30 KeV and a dosage about $10^{15}$ atoms/cm$^2$; and forming a silicide layer on said polysilicon layer.

2. The method as claim 1, wherein said ion implantation uses As and said transistor is a NMOS.

3. The method as claim 1, wherein said ion implantation uses $BF_2$ and said transistor is a PMOS.

4. A method for forming a transistor on a substrate, said method comprising:

forming a gate oxide layer on said substrate;

forming a polysilicon layer on said gate oxide layer;

performing a first ion implantation with a power of about more than 30 KeV on said polysilicon layer;

forming a silicide layer on said polysilicon layer;

patterning and etching said polysilicon layer and said silicide layer to form a gate structure;

annealing said polysilicon layer and said silicide layer;

performing a second ion implantation to form a first doped region in said substrate;

forming a spacer on the side wall of said gate structure to form a gate electrode;

performing a third ion implantation to form a second doped region in said substrate;

forming a dielectric layer over said gate electrode and said first and second doped region;

patterning said dielectric layer to expose said second doped region;

forming a conductive layer over said dielectric layer and said second doped region;

patterning and etching said conductive layer to be coupled to said second doped region; and forming a passivation layer on said conductive layer and said dielectric layer.

5. The method as claim 4, wherein said first ion implantation is performed with a power about 30 KeV.

6. The method as claim 5, wherein the dosage of said first ion implantation is about more than $10^{15}$ atoms/cm$^2$.

7. The method as claim 4, wherein said ion implantation uses As and said transistor is a NMOS.

8. The method as claim 4, wherein said wherein said ion implantation uses $BF_2$ and said transistor is a PMOS.

9. A method for preventing void formation in a gate of a transistor formed in a substrate, the method comprising:

forming a gate oxide layer on said substrate;

forming a polysilicon layer on said gate oxide layer; and performing an ion implantation on said polysilicon layer, said ion implantation performed with a power of at least 30 KeV.

10. The method of claim 9, wherein the dosage of said ion implantation is about $10^{15}$ atoms/cm$^2$.

11. The method of claim 9, wherein the dosage of said ion implantation is about more than $10^{15}$ atoms/cm$^2$.

12. The method of claim 9, further comprising a step of forming a silicide layer having a resistance on said polysilicon layer.

13. The method of claim 12, further comprising a step of performing an annealing process to reduce the resistance of the silicide layer.

14. The method of claim 9, wherein the polysilicon layer has a thickness of about 500–3000 angstroms.

* * * * *

UNITED STATES PATENT AND TRADEMARK OFFICE
CERTIFICATE OF CORRECTION

PATENT NO. : 6,191,019 B1
DATED : February 20, 2001
INVENTOR(S) : C.-C. Liao et al.

Page 1 of 1

It is certified that error appears in the above-identified patent and that said Letters Patent is hereby corrected as shown below:

Title page,
Item [73] Assignee, "Hsnincu" should read -- Hsinchu --

Column 4,
Line 2, "as" should read -- of --
Line 4, "as" should read -- of --
Line 36, "as" should read -- of --
Line 38, "as" should read -- of --
Line 40, "as" should read -- of --
Line 42, "as" should read -- of --; and delete second occurrence of "wherein said".

Signed and Sealed this

Eighteenth Day of December, 2001

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,191,019 B1
DATED         : February 20, 2001
INVENTOR(S)   : C.-C. Liao et al.

It is certified that error appears in the above-identified patent and that said Letters Patent is hereby corrected as shown below:

<u>Title page,</u>
Item [73], Assignee, "Hsnincu" should read -- Hsinchu --.

<u>Column 4,</u>
Lines 2, 4, 36, 38, 40 and 42, "as" should read -- of --
Line 42, delete second occurrence of "wherein said"

Signed and Sealed this

Second Day of July, 2002

Attest:

JAMES E. ROGAN
Attesting Officer   Director of the United States Patent and Trademark Office